(12) United States Patent
Ishiwata

(10) Patent No.: US 6,754,051 B2
(45) Date of Patent: Jun. 22, 2004

(54) SPIN VALVE TRANSDUCER HAVING PARTLY PATTERNED MAGNETORESISTANCE ELEMENT

(75) Inventor: Nobuyuki Ishiwata, Tokyo (JP)

(73) Assignee: TDK Corporation, Tokyo (JP)

(*) Notice: Subject to any disclaimer, the term of this patent is extended or adjusted under 35 U.S.C. 154(b) by 22 days.

(21) Appl. No.: 10/446,106

(22) Filed: May 28, 2003

(65) Prior Publication Data

US 2003/0197981 A1 Oct. 23, 2003

Related U.S. Application Data

(62) Division of application No. 09/532,444, filed on Mar. 23, 2000.

(30) Foreign Application Priority Data

Mar. 24, 1999 (JP) .......................................... 11-079977

(51) Int. Cl.$^7$ ................................................ G11B 5/27
(52) U.S. Cl. ...................................................... 360/319
(58) Field of Search .......................................... 360/319

(56) References Cited

U.S. PATENT DOCUMENTS

| | | | |
|---|---|---|---|
| 4,044,392 A | 8/1977 | Brock et al. ................. | 360/316 |
| 4,663,684 A | 5/1987 | Kamo et al. .................. | 66/104 |
| 5,010,433 A | 4/1991 | Kitada et al. .......... | 360/327.21 |
| 5,434,826 A | 7/1995 | Ravipati et al. ............. | 367/140 |
| 5,910,870 A * | 6/1999 | Ishiwata ...................... | 360/317 |
| 6,125,009 A * | 9/2000 | Ishiwata et al. ............. | 360/317 |

FOREIGN PATENT DOCUMENTS

| | | |
|---|---|---|
| JP | 58-189819 | 11/1983 |
| JP | 60-113313 | 6/1985 |
| JP | RD340071 | 8/1992 |
| JP | 06-274834 | 9/1994 |
| JP | 08-55310 | 2/1996 |
| JP | 08-124122 | 5/1996 |
| JP | 10-149513 | 6/1998 |
| JP | 10-162322 | 6/1998 |
| JP | 10-283617 | 10/1998 |
| JP | 10-289423 | 10/1998 |

OTHER PUBLICATIONS

Robert P. Hunt, "A Magnetoresistive Readout Transducer", IEEE Transactions on Magnetics, vol. MAG-7, No. 1, Mar. 1971, pp. 150-154.

Tsang, et al., "Design, Fabrication & Testing of Spin-Valve Read Heads for High Density Recording", IEEE Transactions on Magnetics, vol. 30, No. 6, Nov. 1994, pp. 3801-3806.

* cited by examiner

Primary Examiner—David Davis
(74) Attorney, Agent, or Firm—McGinn & Gibb, PLLC

(57) ABSTRACT

In a spin valve type transducer including two magnetic shield layers, a patterned magnetoresistance element is in direct contact with one of the magnetic shield layers. A permanent magnet layer and an electrode layer are formed on the sides of the patterned magnetoresistance element.

11 Claims, 16 Drawing Sheets

SPIN VALVE TRANSDUCER HAVING PARTLY PATTERNED MAGNETORESISTANCE ELEMENT

The present Application is a Divisional Application of U.S. patent application Ser. No. 09/532,444, filed on Mar. 23, 2000.

FIELD OF THE INVENTION

The present invention relates to a magnetoresistance (MR) apparatus, and more particularly, to a spin valve type transducer capable of reducing a reproducing gap to less than 0.1 µm.

As magnetic storage apparatuses have been developed in size and capacity, highly sensitive magnetoresistive (MR) transducers (heads) have been put into practical use (see: Robert P. Hunt, "A Magnetoresistive Readout Transducer ", IEEE Trans. on Magnetics, Vol. MAG-7, No. 1, pp. 150–154, Mar. 1971). Since use is made of the anisotropy magnetoresistance (AMR) effect of NiFe alloy, these MR heads are called AMR heads.

Recently, more highly sensitive giant magnetoresistance (GMR) transducers (heads) which are called spin valve type transducers, have also been developed in order to achieve higher area recording density (see: Ching Tsang et al., "Design, Fabrication & Testing of Spin-Valve Read Heads for High Density Recording ", IEEE Trans. on Magnetics, Vol. 30, No. 6, pp. 3801–3806, Nov. 1994). A typical spin valve type transducer includes a spin valve structure which is constructed by a free ferromagnetic layer, a pinned ferromagnetic layer and a non-magnetic conductive layer sandwiched by the free ferromagnetic layer and the pinned ferromagnetic layer, and a pinning ferromagnetic layer for pinning the magnetic domain of the pinned ferromagnetic layer. In the spin valve type transducer, the resultant response is given by a cosine of an angle between the magnetization directions of the free ferromagnetic layer and the pinned ferromagnetic layer.

A prior art spin valve type transducer is constructed by two magnetic shield layers, two gap layers (magnetic isolation layers) each adhered to the inside of one of the magnetic shield layers, a spin valve structure sandwiched by the gap layers, a permanent magnet layer provided at the sides of the spin valve structure to provide magnetic domain control over the free ferromagnetic layer in order to suppress the Barkhausen noise, and an electrode layer formed on the permanent magnet layer (see JP-A-10-162322 & JP-A-10-149513). This will be explained later in detail.

In the above-described prior art spin valve type transducer, however, since the spin valve structure is sandwiched by the two gap layers, the resolution of the transducer, i.e., a reproducing gap between the two magnetic shield layers cannot be less than 0.1 µm, which will be explained later.

Generally, a bit length for showing the density of bits on a medium is denoted by the number of inversions of magnetic fluxes per inch, i.e., kilo flux changes per inch (kFCI). For example, if the bit length is 200 kFCI, one inversion length is 125 nm and one period is 250 nm. Therefore, the reproducing gap 0.1 µm (100 nm) is enough for 200 kFCI. Also, if the bit length is 400 kFCI, one inversion length is 62.5 nm and one period is 125 nm. Therefore, the reproducing gap 0.1 µm (100 nm) is also enough for 400 kFCI. On the other hand, if the bit length is 500 kFCI, one inversion length is 50 nm and one period is 100 nm, the reproducing gap 0.1 µm (100 nm) is insufficient for 500 kFCI.

SUMMARY OF THE INVENTION

It is an object of the present invention to provide a spin valve type transducer capable of reducing a reproducing gap to less than 0.1 µm.

According to the present invention, in a spin valve type transducer including two magnetic shield layers, a patterned magnetoresistance element is in direct contact with one of the magnetic shield layers. A permanent magnet layer and an electrode layer are formed on the sides of the patterned magnetoresistance element.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art spin valve type transducers will be explained with reference to FIGS. 1, 2A, 2B and 3.

Figure 1:
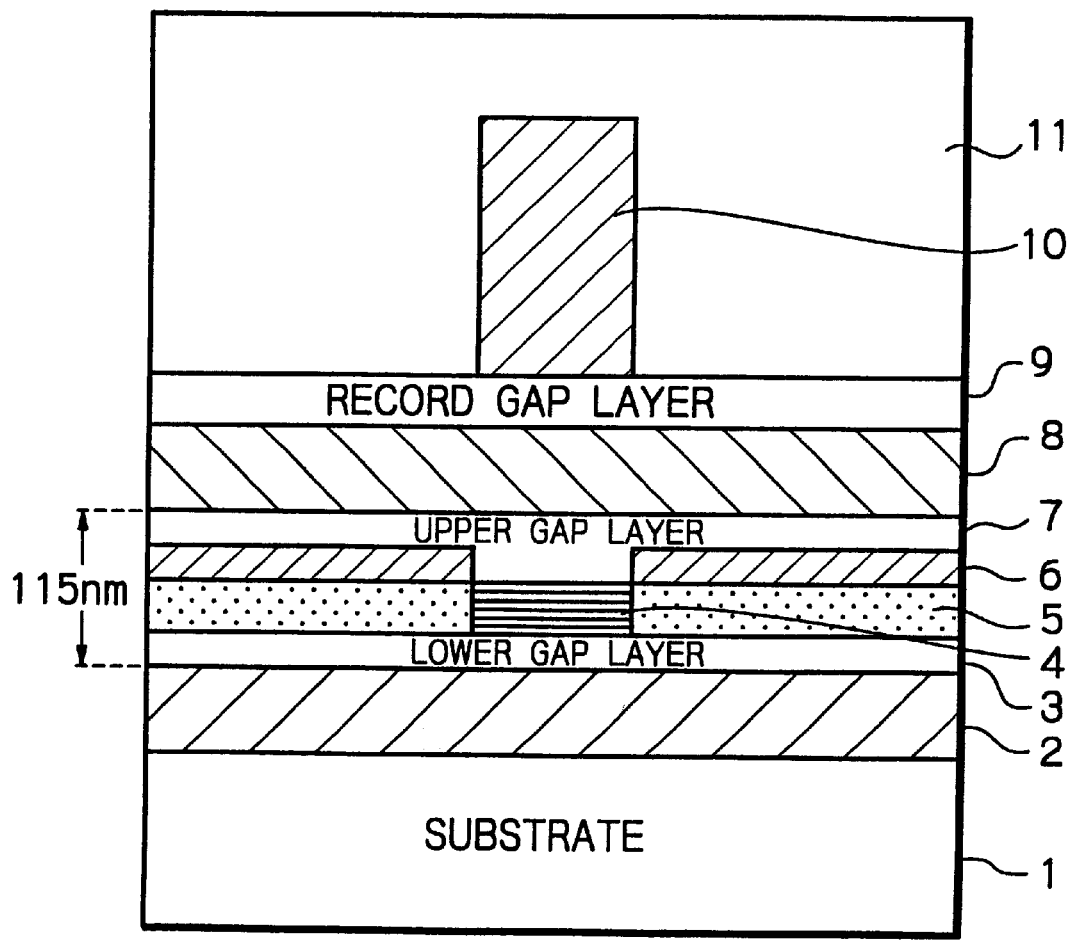
FIG. 1 is a cross-sectional, air bearing surface (ABS) view illustrating a prior art spin valve type transducer.

In FIG. 1, which illustrates a prior art spin valve type transducer (see JP-A-10-162322 & JP-A-10-149513), reference numeral 1 designates a substrate made $Al_2O_3TiC$ which serves as a slider. Also, an about 1 µm thick lower magnetic shield layer 2 made of NiZn ferrite is deposited on the substrate 1, and an about 30 nm thick lower gap layer (lower magnetic isolation layer) 3 made of alumina ($Al_2O_3$) is deposited on the lower magnetic shield layer 2.

A spin valve structure 4 is deposited on the lower gap layer 3 by a magnetron sputtering process, a radio frequency sputtering process or an ion beam sputtering process, and is patterned by an ion beam etching process. The spin valve structure 4 will be explained later in detail.

Also, an about 20 nm thick permanent magnet layer 5 made of CoPt and an about 80 nm thick electrode layer 6 made of gold (Au) are formed on the lower gap layer 3 on the sides of the spin valve structure 4.

Further, an about 50 nm thick upper gap layer (upper magnetic isolation layer) 7 made of alumina, an about 2 μm thick upper magnetic shield layer 8 made of NiFe, an about 0.1 μm thick record gap layer 9 made of alumina and an about 2 μm thick patterned magnetic pole layer 10 made of CoFeNi are formed on the spin valve structure 4 and the electrode layer 6. Also, the magnetic pole layer 10 is coated by an alumina layer 11.

Note that an exciting winding (not shown) isolated by a photoresist layer (not shown) is formed between the upper magnetic shield layer 8 and the magnetic pole layer 10.

Figure 2A:
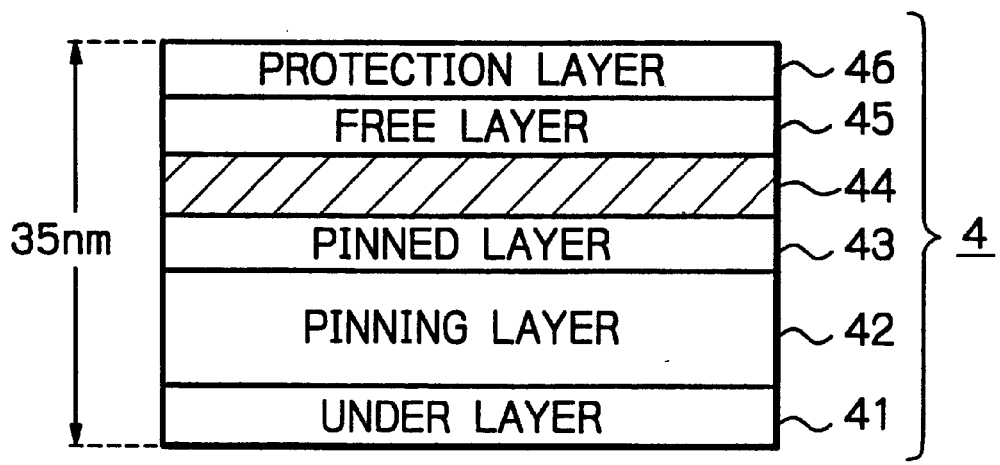
FIGS. 2A and 2B are cross-sectional views of the spin valve structure of FIG. 1.
Figure 2B:
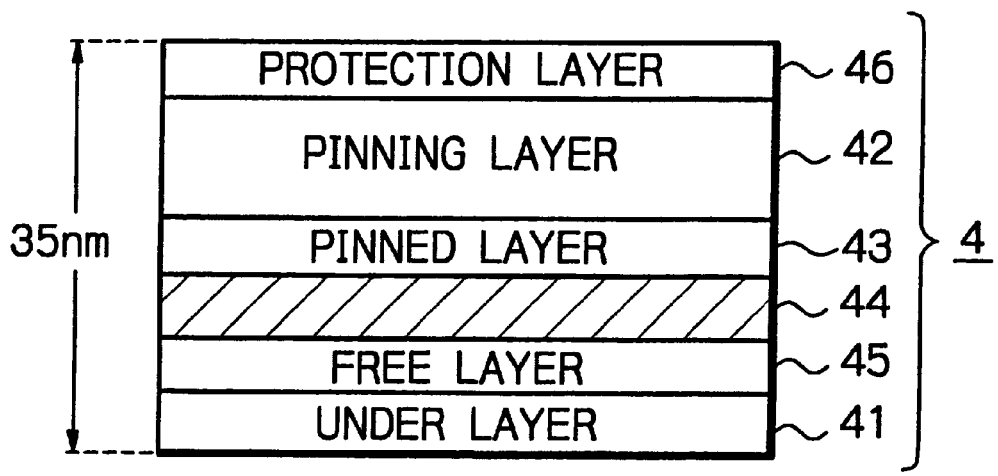

The spin valve structure 4 of FIG. 1 is illustrated in detail in FIGS. 2A and 2B.

In FIG. 2A, the spin valve structure 4 is formed by an about 3 nm thick underlayer 41 made of Zr, an about 20 nm thick pinning layer 42 made of antiferromagnetic material such as PtMn, an about 3 nm thick pinned layer 43 made of CoFe, an about 2.1 nm thick non-magnetic conductive layer 44 made of Cu, an about 3.5 nm thick free layer 45 made of ferromagnetic material such as about 0.5 nm thick CoFe and about 3 nm thick NiFe, and an about 3 nm thick protection layer 46 made of Zr.

On the other hand, in FIG. 2B, the sequence of the pinning layer 42, the pinned layer 43, the non-magnetic conductive layer 44 and the free layer 45 of FIG. 2A is reversed.

In FIGS. 2A and 2B, the width of the spin valve structure 4 is about 0.4 μm, and the thickness of the spin valve structure 4 is about 35 nm.

Note that the pinning layer 42 for pinning the pinned layer 43 needs to be heat-resistant. Although PtMn is heat-resistant enough, it needs to be thicker than about 20 nm to sufficiently exhibit antiferromagnetism. On the other hand, even if IrMn is 7 nm thick, it can exhibit excellent antiferromagnetism, however, IrMn is not heat-resistant.

As stated above, the lower gap layer 3 is made of alumina. Since alumina is deposited by a sputtering process, it cannot be thin due to the deterioration of the insulating characteristics caused by pinholes. In order to suppress the generation of pinholes, the lower gap layer 3 needs to be at least 30 nm thick.

On the other hand, the upper gap layer 7 is also made of alumina having good insulating characteristics. Besides the upper gap layer 7 needs to cover a step between the spin valve structure 4 and the electrode layer 6. In this case, the electrode layer 6 needs to be 80 nm thick to achieve a high signal-to-noise (S/N) ratio, even if the electrode layer 6 is made of Au. Therefore, the step between the spin valve structure 4 and the electrode layer 6 is 20 nm (permanent magnet layer 5)
+80 nm (electrode layer 6)
−35 nm (spin valve structure 4)
=65 nm In order to cover the step of 65 nm, the upper gap layer 7 needs to be at least 50 nm.

Since the resolution of a spin valve type transducer is generally defined by a reproducing gap between the two magnetic shield layers, the resolution of the spin valve type transistor of FIG. 1 is 30 nm (lower gap layer 3)
+35 nm (spin valve structure 4)
+50 nm (upper gap layer 7)
=115 nm Note that, even if the pinning layer 42 is made of 7 nm thick IrMn, the reproducing gap is 102 nm.

Thus, in the spin valve type transducer of FIG. 1, it is impossible to reduce the reproducing gap to less than 0.1 μm.

Figure 3:
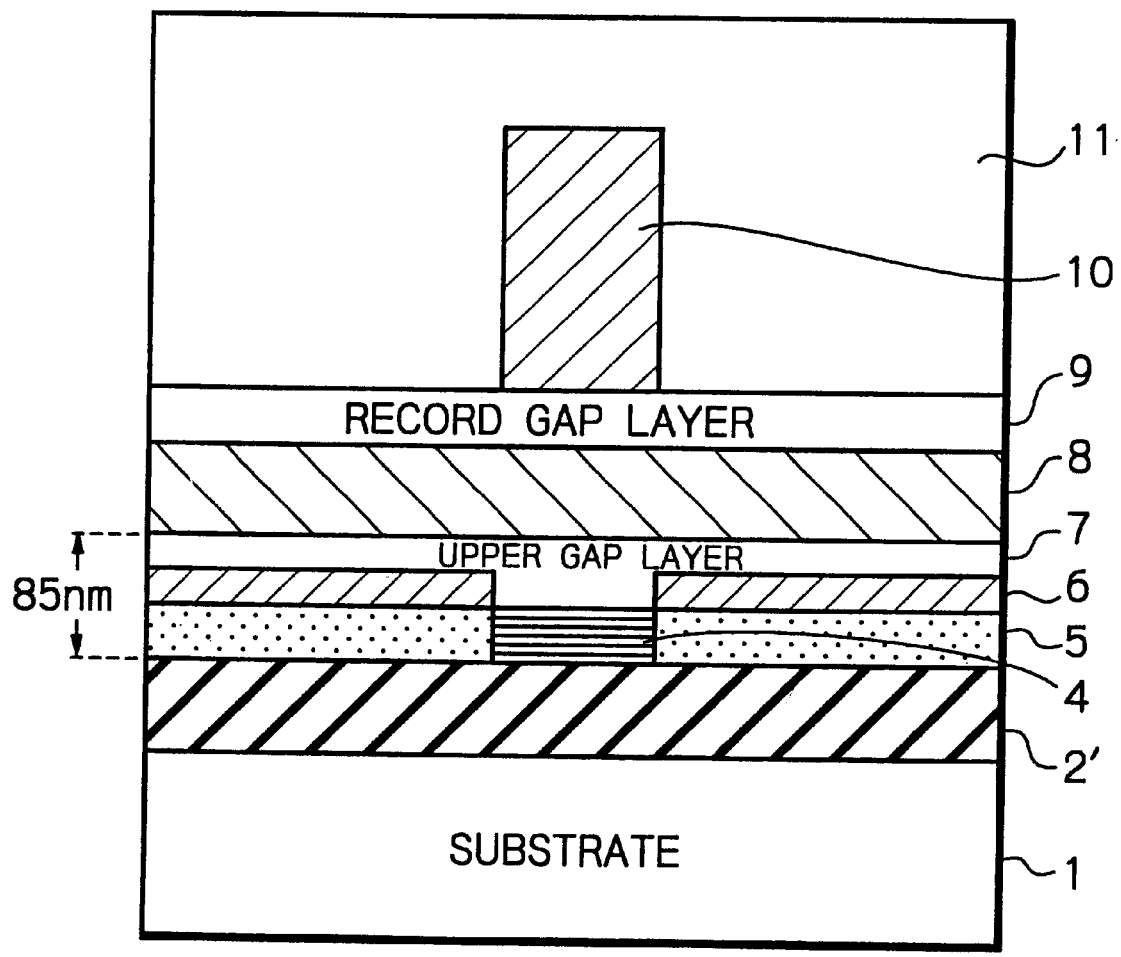
FIG. 3 is a cross-sectional view illustrating a modification of the spin valve transducer of FIG. 1.

In FIG. 3, which is a modification of the spin valve type transducer of FIG. 1, the lower magnetic shield layer 2 of FIG. 1 is replaced by an insulating lower magnetic shield layer 2', and the lower gap layer 3 of FIG. 1 is omitted. Therefore, the resolution of the spin valve type transducer of FIG. 3 is 35 nm (spin valve structure 4)
+50 nm (upper gap layer 7)
=85 nm Thus, it is possible to reduce the reproducing gap less than 0.1 μm.

Figure 4:
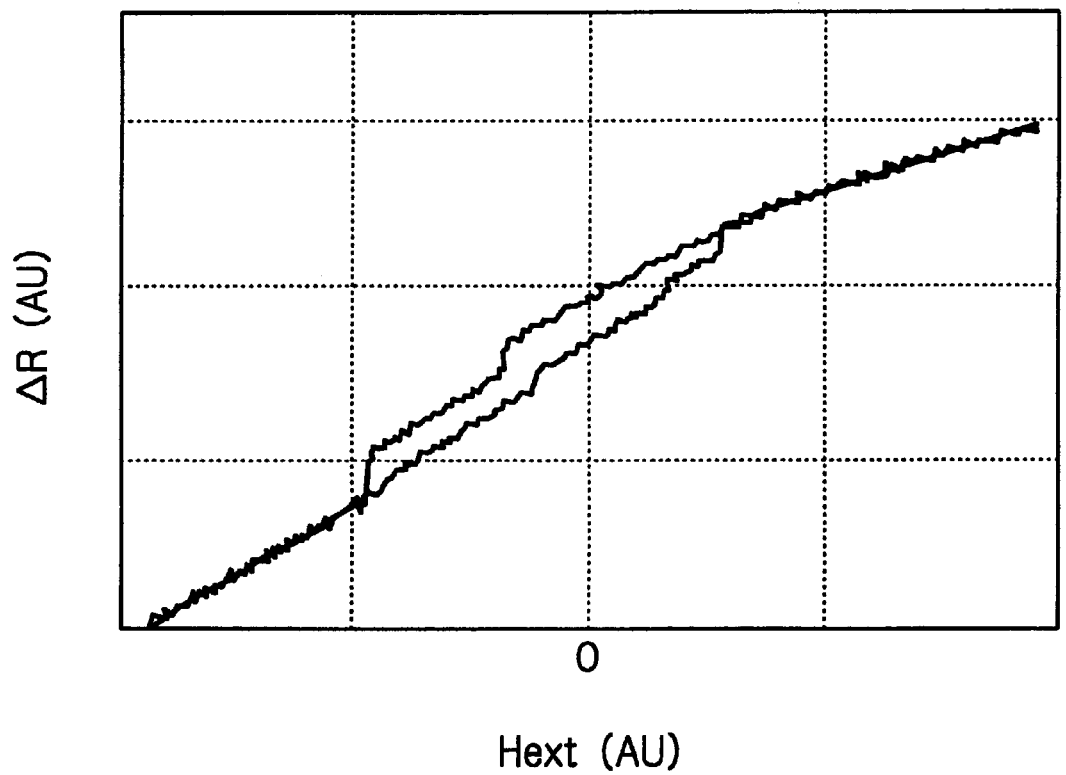
FIG. 4 is a graph showing the magnetoresistance-external field of the transducer of FIG.3.

In the spin valve type transducer of FIG. 3, however, since a gap layer (magnetic isolation layer) is not provided between the permanent magnet layer 5 and the insulating lower magnetic shield layer 2', the magnetic lines of force generated from the permanent magnet layer 5 is leaked into the insulating lower magnetic shield layer 2', so that the magnetic domain of the free layer 45 of the spin valve structure 4 cannot be sufficiently controlled by the permanent magnet layer 5. As a result, a large hysteresis is created in a magnetoresistance and magnetic field (R-H) loop as shown in FIG. 4, which also increases wiggled waveforms due to the Baukhausen noise in regenerated signals.

Figure 5:
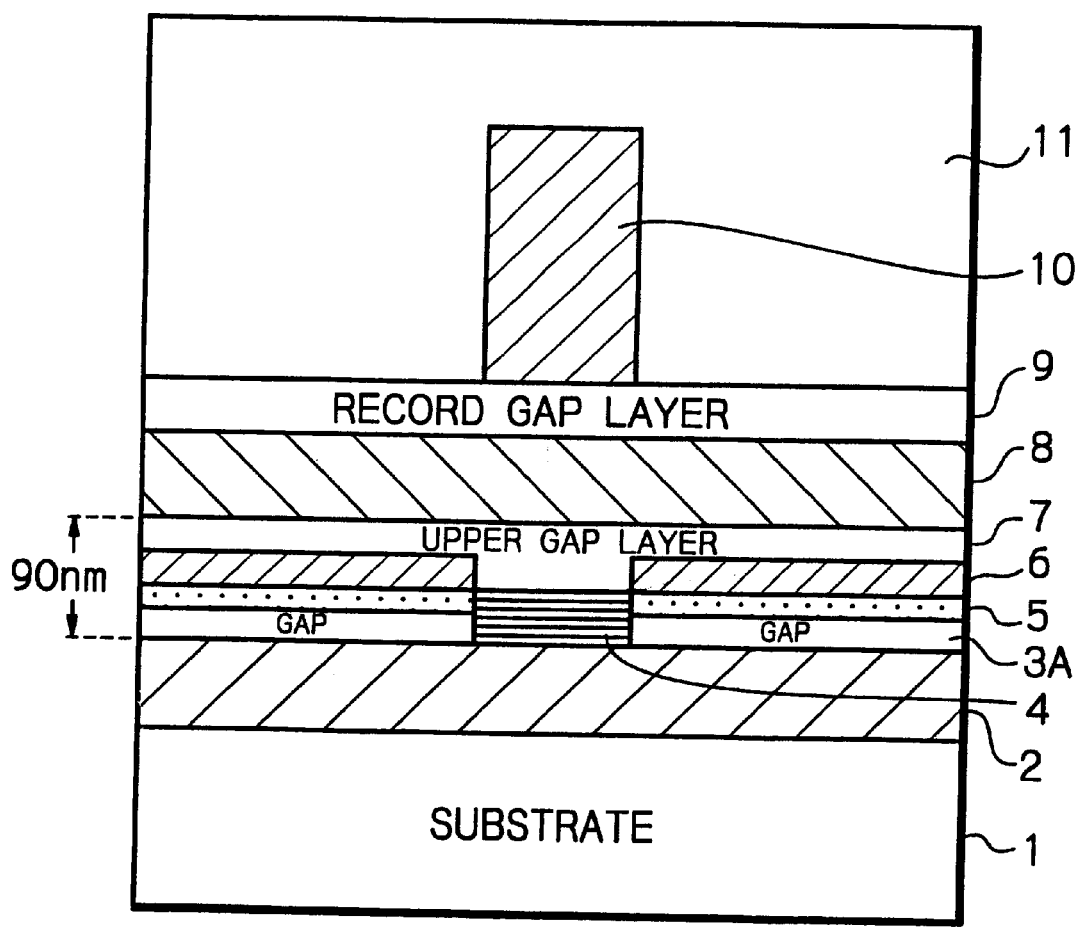
FIG. 5 is a cross-sectional, ABS view illustrating a first embodiment of the spin valve type transducer according to the present invention.

In FIG. 5, which illustrates a first embodiment of the present invention, an about 10 nm thick magnetic isolation layer 3A made of Cr is provided only between the permanent magnet layer 5 and the lower magnetic shield layer 2 instead of the lower gap layer 3 of FIG. 1. Note, that the thickness of the magnetic isolation layer 3A can be between 1 nm and 100 nm. That is, the spin valve structure 4 is in direct contact with the lower magnetic shield layer 2. Also, the spin valve structure 4 has the same configuration as illustrated in FIG. 2A. Note that the upper gap layer 7 is made about 55 nm thick, since the electrode layer 6 is made about 25 nm thick and a step between the spin valve structure 4 and the electrode layer 6 is a little larger. Therefore, the resolution of the spin valve type transducer of FIG. 5 is 35 nm (spin valve structure 4)
+55 nm (upper gap layer 7)
=90 nm Thus, it is possible to reduce the reproducing gap to less than 0.1 μm.

Figure 6:
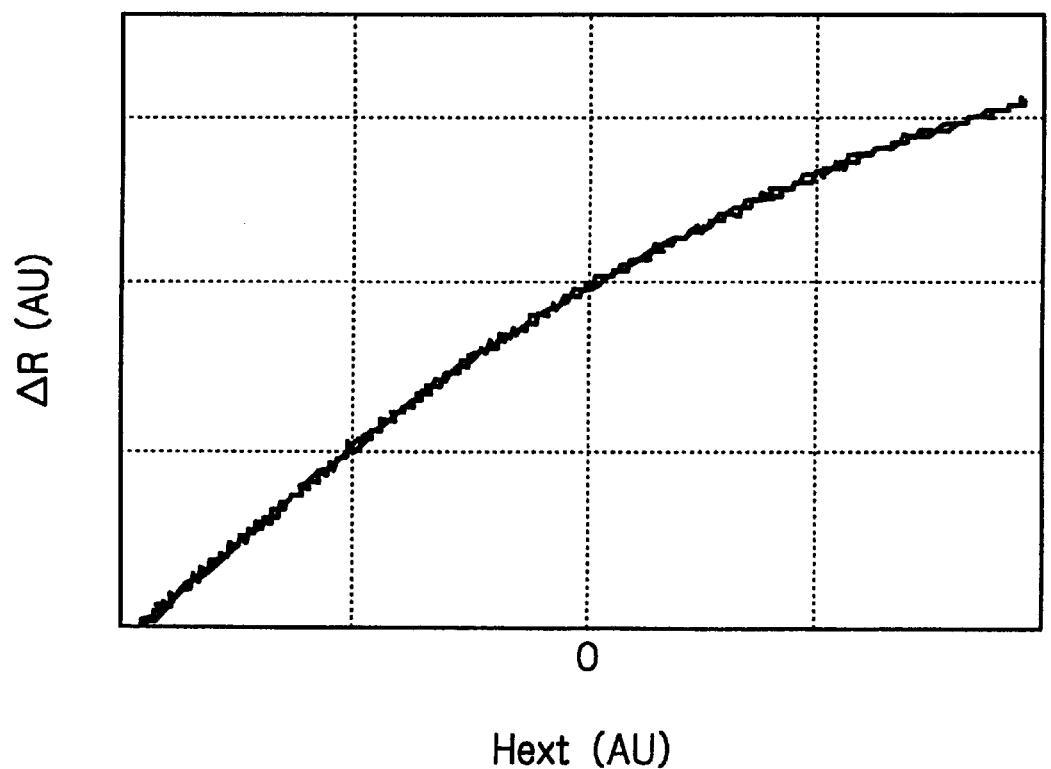
FIG. 6 is a graph showing the magnetoresistance-external field of the transducer of FIG. 5.

In the spin valve type transducer of FIG. 5, since the magnetic isolation layer 3A is provided between the permanent magnet layer 5 and the insulating lower magnetic shield layer 2, the magnetic lines of force generated from the permanent magnet layer 5 hardly leak into the lower magnetic shield layer 2, so that the magnetic domain of the free layer 45 of the spin valve structure 4 can be sufficiently controlled by the permanent magnet layer 5. As a result, no large hysteresis is created in a magnetoresistance and magnetic field (R-H) loop as shown in FIG. 6, which also decreases wiggled waveforms due to the Baukhausen noise in regenerated signals.

Figure 7:
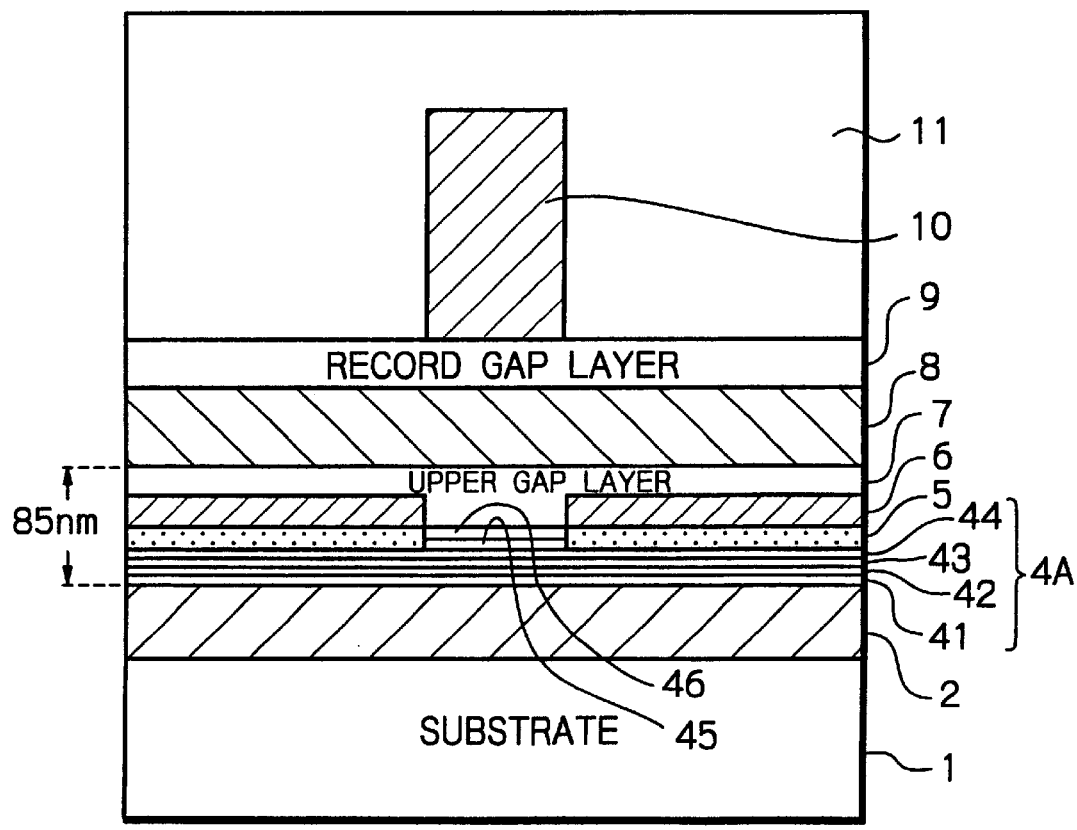
FIG. 7 is a cross-sectional, ABS view illustrating a second embodiment of the spin valve type transducer according to the present invention.

In FIG. 7, which illustrates a second embodiment of the present invention, a spin valve structure 4A is provided instead of the spin valve structure 4 of FIG. 1. The spin valve structure 4A has the same configuration as illustrated in FIG. 2A except that the width of the free layer 45 and the protection layer 46 is about 0.3 µm while the width of the underlayer 41, the pinning layer 42, the pinned layer 43 and the non-magnetic conductive layer 44 is the same as that of the lower magnetic shield layer 2 and the substrate 1. Therefore, the underlayer 41, the pinning layer 42, the pinned layer 43 and the non-magnetic conductive layer 44 serve as the lower gap layer 3 of FIG. 1. In this case, the spin valve structure 4A is in direct contact with the lower magnetic shield layer 2, and therefore, the resolution of the spin valve type transducer of FIG. 7 is 35 nm (spin valve structure 4)
+50 nm (upper gap layer 7)
=85 nm Thus, it is possible to reduce the reproducing gap to less than 0.1 µm.

In the spin valve type transducer of FIG. 7, since the non-magnetic conductive layer 44 is provided between the permanent magnet layer 5 and the lower magnetic shield layer 2, the magnetic lines of force generated from the permanent magnet layer 5 hardly leak into the lower magnetic shield layer 2, so that the magnetic domain of the free layer 45 of the spin valve structure 4A can be sufficiently controlled by the permanent magnet layer 5. As a result, no large hysteresis is created in a magnetoresistance and magnetic field (R-H) loop as shown in FIG. 6, which also decreases wiggled waveforms due to the Baukhausen noise in regenerated signals.

Figure 8:
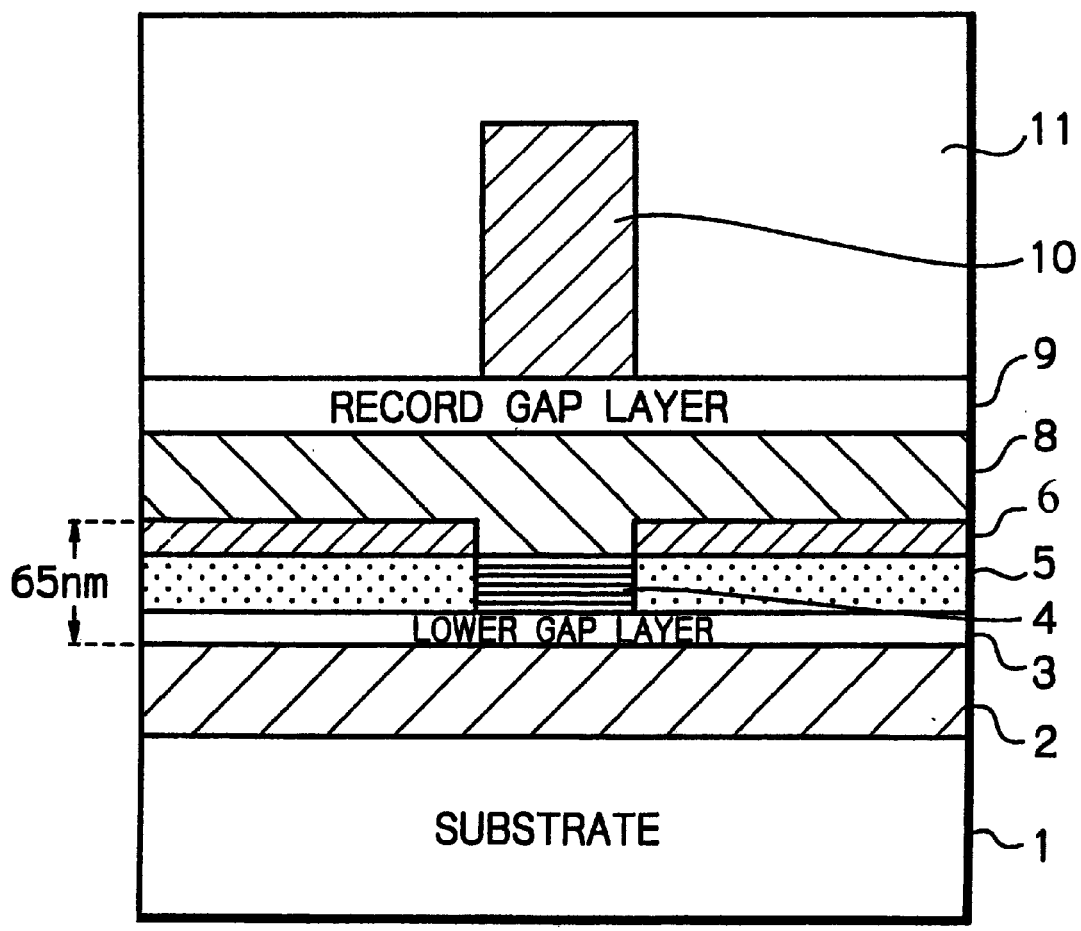
FIG. 8 is a cross-sectional, ABS view illustrating a third embodiment of the spin valve type transducer according to the present invention.

In FIG. 8, which illustrates a third embodiment of the present invention, the spin valve structure 4 has the same configuration as illustrated in FIG. 2B. Also, the electrode layer 7 is about 90 nm thick. Further, the upper gap layer 7 of FIG. 1 is not provided, so that the spin valve structure 4 is in direct contact with the upper magnetic shield layer 8. Therefore, the resolution of the spin valve type transducer of FIG. 8 is 30 nm (lower gap layer 3)
+35 nm (spin valve structure 4)
=65 nm Thus, it is possible to reduce the reproducing gap to less than 0.1 µm.

In the spin valve type transducer of FIG. 8, since the lower gap layer 3 is provided between the permanent magnet layer 5 and the lower magnetic shield layer 2, the magnetic lines of force generated from the permanent magnet layer 5 hardly leak into the lower magnetic shield layer 2, so that the magnetic domain of the free layer 45 of the spin valve structure 4 can be sufficiently controlled by the permanent magnet layer 5. As a result, no large hysteresis is created in a magnetoresistance and magnetic field (R-H) loop as shown in FIG. 6, which also decreases wiggled waveforms due to the Baukhausen noise in regenerated signals. Note that the magnetic lines of force generated from the permanent magnet layer 5 toward the upper magnetic shield layer 8 are stopped by the thin electrode layer 7.

Figure 9:
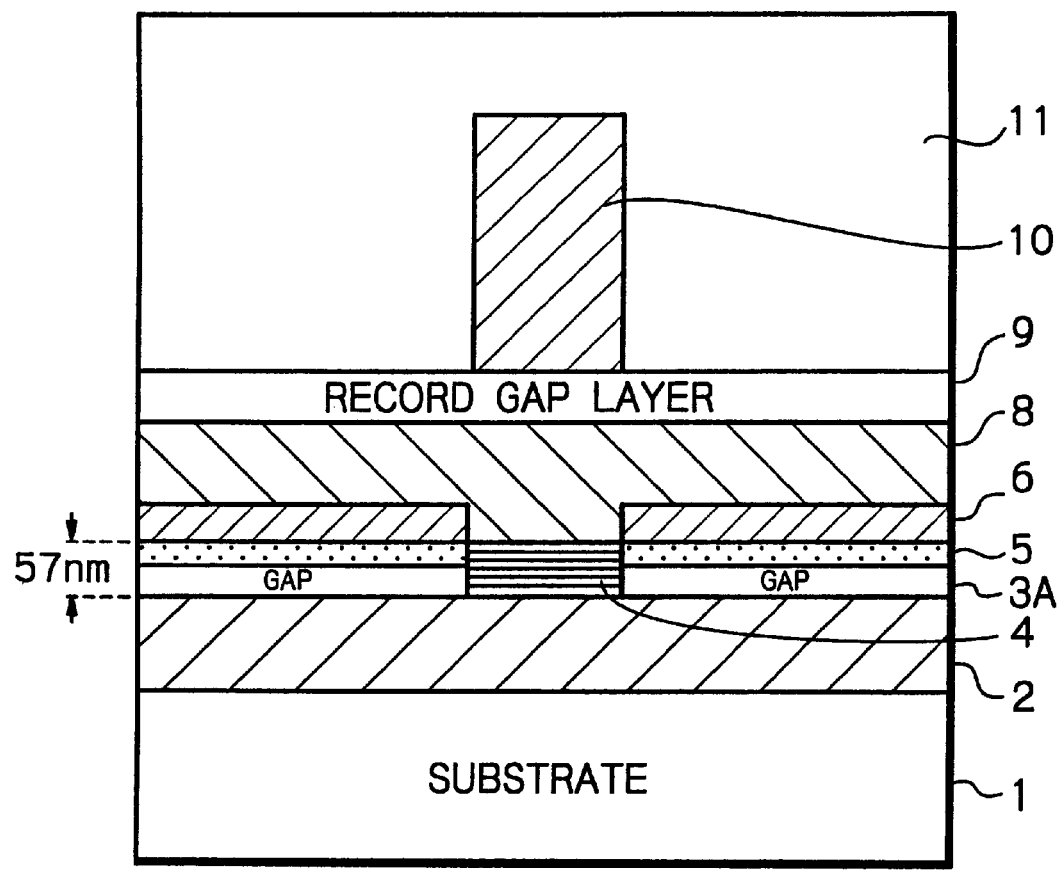
FIG. 9 is a cross-sectional, ABS view illustrating a fourth embodiment of the spin valve type transducer according to the present invention.

In FIG. 9, which illustrates a fourth embodiment of the present invention, the first embodiment as illustrated in FIG. 5 is combined with the third embodiment as illustrated in FIG. 8. That is, an about 5 nm thick magnetic isolation layer 3A made of Cr is provided only between the permanent magnet layer 5 and the lower magnetic shield layer 2 instead of the lower gap layer 3 of FIG. 1. As a result, the spin valve structure 4 is in direct contact with the lower magnetic shield layer 2. In this case, the spin valve structure 4 has the same configuration as illustrated in FIG. 2A. On the other hand, the upper gap layer 7 of FIG. 1 is not provided, so that the spin valve structure 4 is in direct contact with the upper magnetic layer 8.

In FIG. 5, the free layer 45 is on the lower side of the reproducing gap. In view of the sensitivity, it is preferable that the free layer 45 be in the center of the reproducing gap. Therefore, in FIG. 9, in order to locate the free layer 45 in the center of the reproducing gap, the thickness of the layers are made as follows:

underlayer 41: 3 nm pinning layer 42: 20 nm pinned layer 43: 2 nm non-magnetic conductive layer 44: 2.1 nm free layer 45: 2.5 nm (0.5 nm CoFe/2 nm NiFe)

protection layer 46: 27 nm

In this case, the reproducing gap is 57 nm. Therefore, the resolution of the spin valve type transducer of FIG. 9 is 57 nm (spin valve structure 4)
=57 nm Thus, it is possible to reduce the reproducing gap to less than 0.1 µm.

In the spin valve type transducer of FIG. 9, since the magnetic isolation layer 3A is provided between the permanent magnet layer 5 and the insulating lower magnetic shield layer 2, the magnetic lines of force generated from the permanent magnet layer 5 hardly leak into the lower magnetic shield layer 2, so that the magnetic domain of the free layer 45 of the spin valve structure 4 can be sufficiently controlled by the permanent magnet layer 5. As a result, no large hysteresis is created in a magnetoresistance and magnetic field (R-H) loop as shown in FIG. 6, which also decreases wiggled waveforms due to the Baukhausen noise in regenerated signals.

Figure 10:
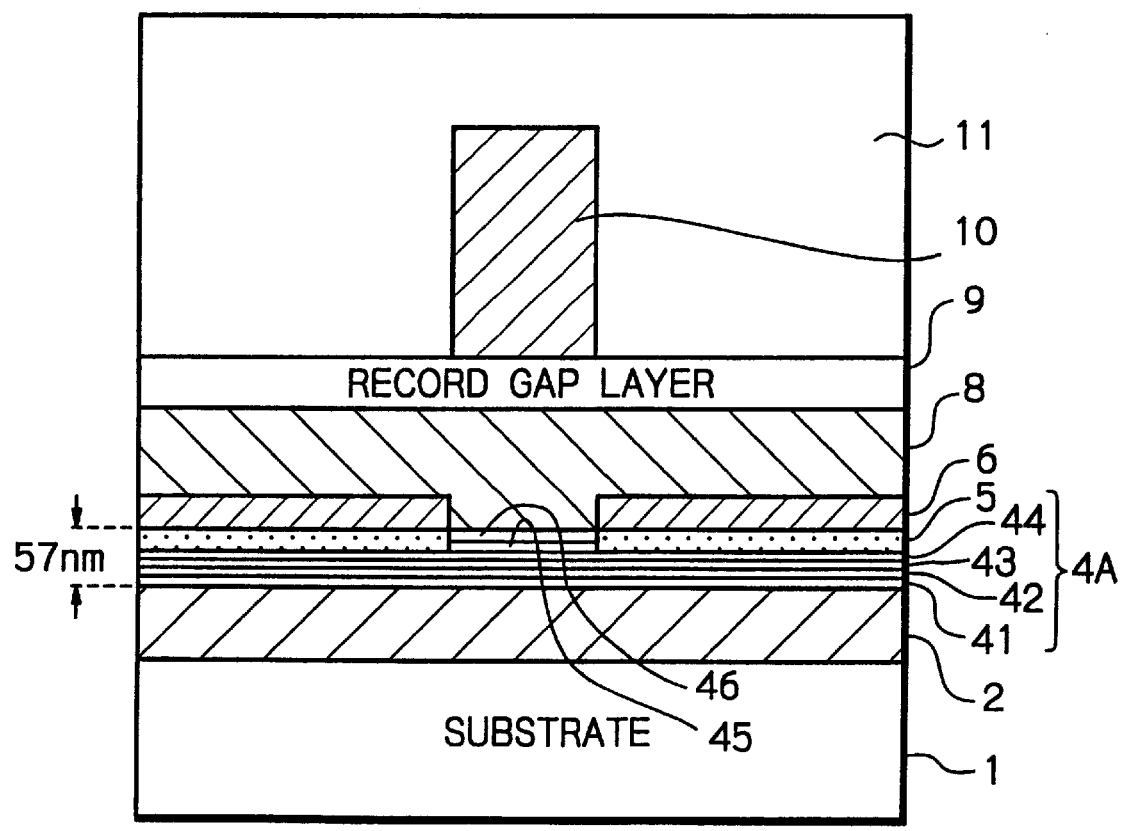
FIG. 10 is a cross-sectional, ABS view illustrating a fifth embodiment of the spin valve type transducer according to the present invention.
Figure 11:
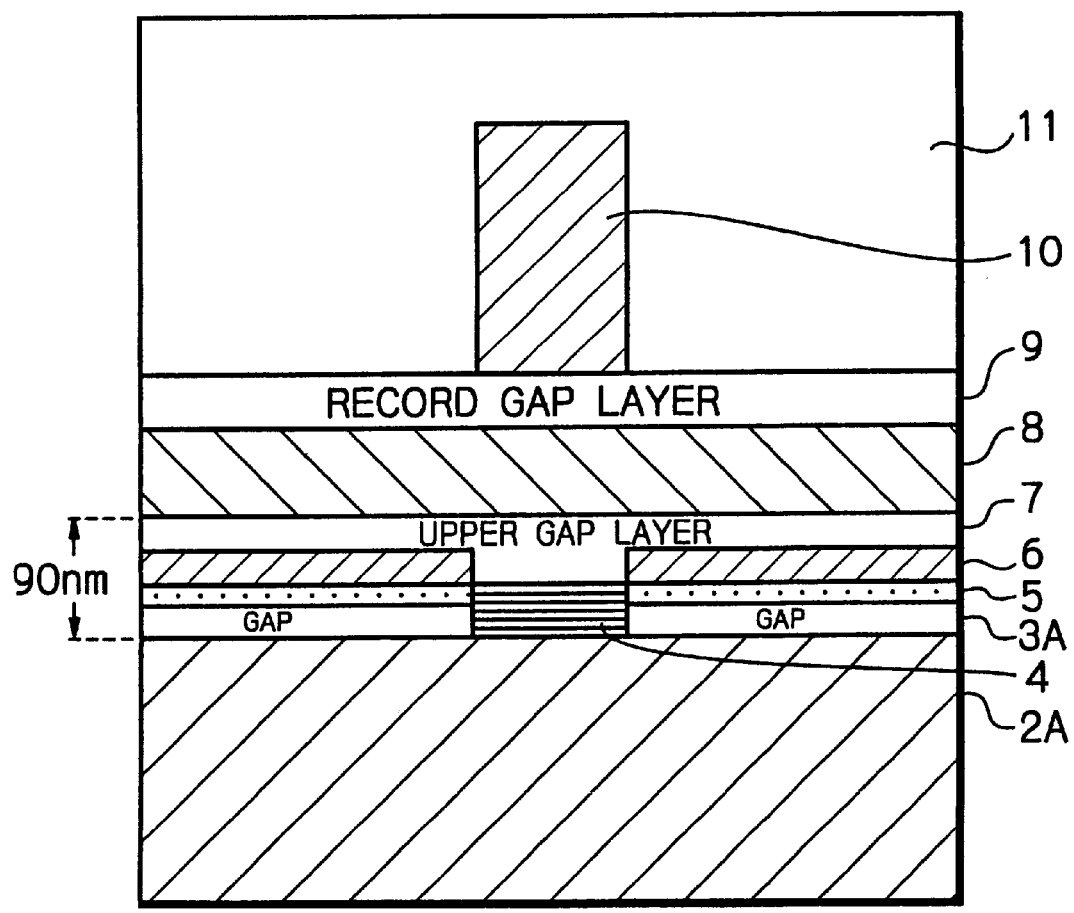
FIGS. 11, 12, 13, 14 and 15 are cross-sectional, ABS views illustrating modifications of the transducers of FIGS. 5, 7, 8, 9 and 10, respectively.
Figure 12:
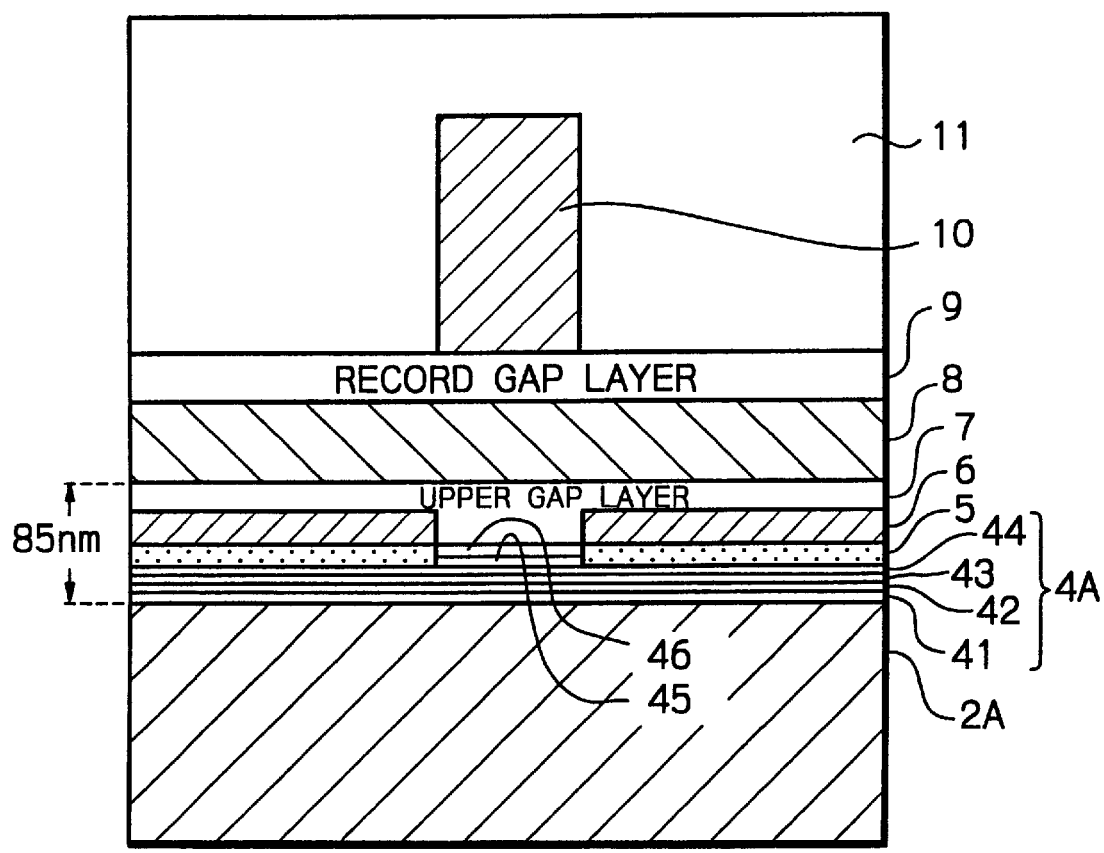
Figure 13:
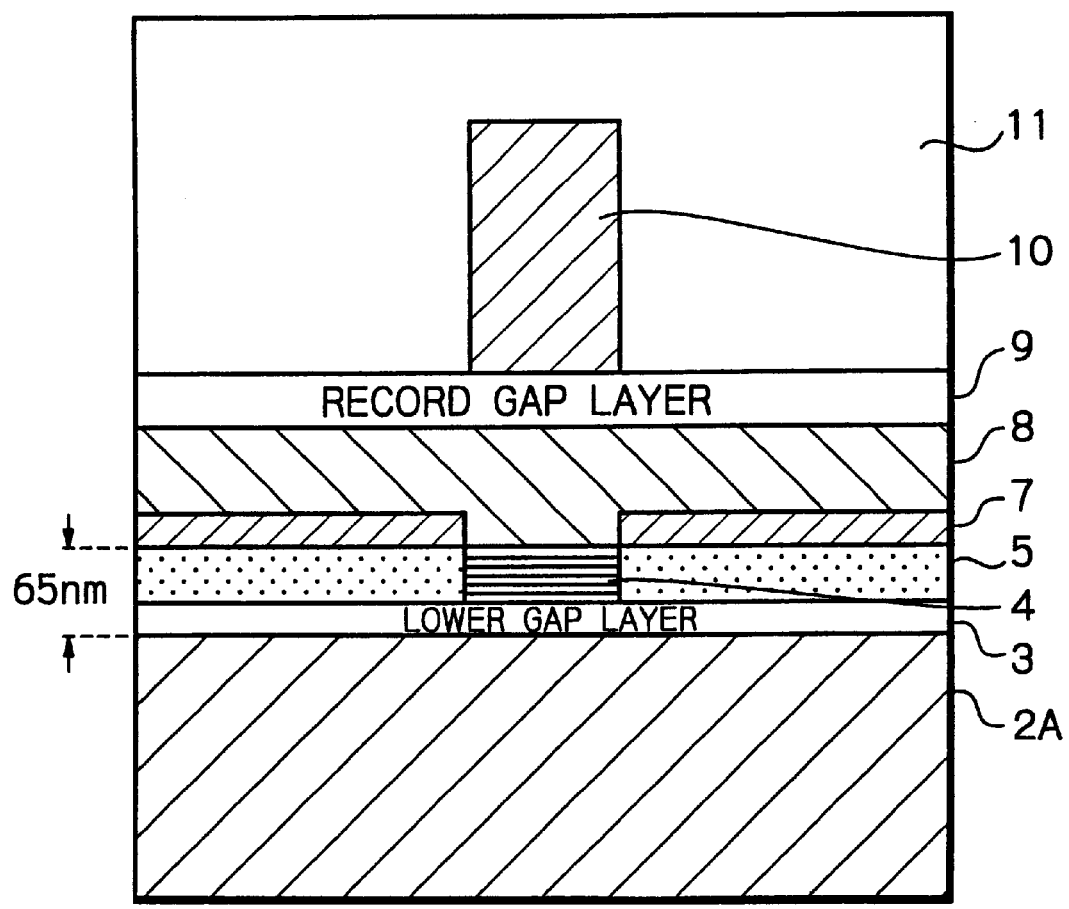
Figure 14:
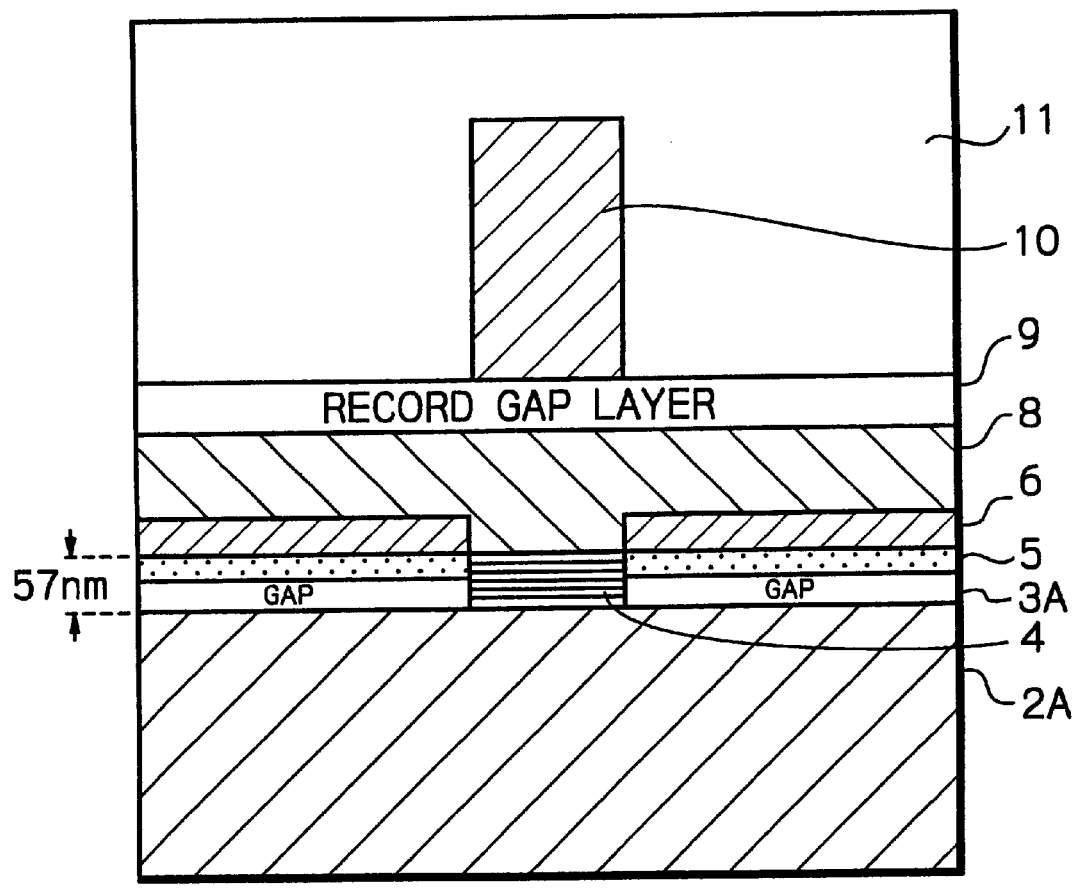
Figure 15:
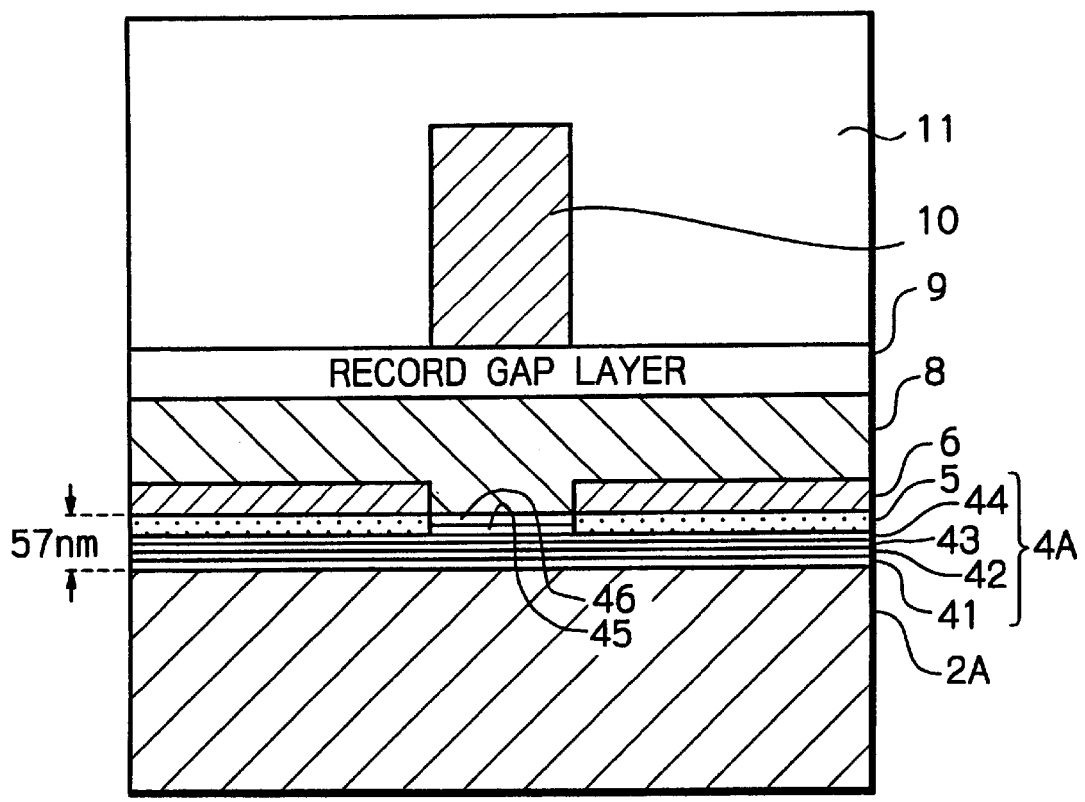

In FIG. 10, which illustrates a fifth embodiment of the present invention, the second embodiment as illustrated in FIG. 7 is combined with the third embodiment as illustrated in FIG. 8. That is, the spin valve structure 4A of FIG. 7 is provided instead of the spin valve 4 of FIG. 1. As a result, the spin valve structure 4A is in direct contact with the lower magnetic shield layer 2. On the other hand, the upper gap layer 7 of FIG. 1 is not provided, so that the spin valve structure 4 is in direct contact with the upper magnetic layer 8.

Even in FIG. 10, in order to locate the free layer 45 in the center of the reproducing gap to improve the sensitivity, the thickness of the layers are made as follows:

underlayer 41: 3 nm pinning layer 42: 20 nm pinned layer 43: 2 nm non-magnetic conductive layer 44: 2.1 nm free layer 45: 2.5 nm (0.5 nm CoFe/2 nm NiFe)

protection layer 46: 27 nm

In this case, the reproducing gap is 57 nm. Therefore, the resolution of the spin valve type transducer of FIG. 10 is 57 nm (spin valve structure 4)
=57 nm Thus, it is possible to reduce the reproducing gap to less than 0.1 µm.

In the spin valve type transducer of FIG. 10, since the non-magnetic conductive layer 44 is provided between the permanent magnet layer 5 and the insulating lower magnetic shield layer 2, the magnetic lines of force generated from the permanent magnet layer 5 hardly leak into the lower magnetic shield layer 2, so that the magnetic domain of the free layer 45 of the spin valve structure 4 can be sufficiently controlled by the permanent magnet layer 5. As a result, no large hysteresis is created in a magnetoresistance and magnetic field (R-H) loop as shown in FIG. 6, which also decreases wiggled waveforms due to the Baukhausen noise in regenerated signals.

In the transducers of FIGS. 9 and 10, the thickness of the layers can be made as follows:

underlayer 41: 3 nm pinning layer 42: 15 nm pinned layer 43: 2 nm non-magnetic conductive layer 44: 2.1 nm free layer 45: 2.5 nm (0.5 nm CoFe/2 nm NiFe) protection layer 46: 22 nm In this case, the reproducing gap is 47 nm. Therefore, in this case, the resolution of the spin valve type transducer of FIGS. 9 and 10 is 47 nm (spin valve structure 4)

=47 nm

Thus, it is possible to reduce the reproducing gap less than 0.05 $\mu$m, which is sufficient for 1000 kFCI where one inversion length is 25 nm and one period is 50 nm.

In FIGS. 11, 12, 13, 14 and 15, which illustrate modifications of the transducers of FIGS. 5, 7, 8, 9 and 10, respectively, a NiZn ferrite substrate 2A is provided instead of the $Al_2O_3$?TiC substrate 1 and the NiZn ferrite lower magnetic shield layer 2, thus reducing the manufacturing cost.

The method for manufacturing the transducer of FIG. 5 is explained below.

First, an about 1 $\mu$m thick lower magnetic shield layer 2 made of NiZn ferrite is deposited on a substrate 1 made of $Al_2O_3$TiC. Note that other soft magnetic ferrite materials can be used instead of NiZn ferrite.

Next, a spin valve structure 4 is deposited on the lower magnetic shield layer 2 by a magnetron sputtering process, a radio frequency sputtering process or an ion beam sputtering process. That is, an about 3 nm thick underlayer 41 made of Zr, an about 20 nm thick pinning layer 42 made of PtMn, an about 3 nm thick pinned layer 43 made of CoFe, an about 2.1 nm thick non-magnetic conductive layer 44 made of Cu, an about 3.5 nm thick free layer 45 made of about 0.5 nm thick CoFe and about 30 nm thick NiFe, and an about 3 nm thick protection layer 46 made of Zr are sequentially deposited on the lower magnetic shield layer 2.

Next, a photoresist pattern (not shown) is formed on the spin valve structure 4. Then, the spin valve structure 4 is patterned by an ion beam etching process using the photoresist pattern as a mask. As a result, the spin valve structure 4 is mesa-shaped due to the small ion beam scattering phenomenon.

Next, an about 10 nm thick magnetic gap layer (magnetic isolation layer) 3A made of Cr, an about 25 nm thick permanent magnet layer 5 made of CoPt and an about 80 nm thick electrode layer 6 made of Au are sequentially deposited on the entire surface by an ion beam sputtering process using an Ar gas pressure of about $1.33 \times 10^{-3}$ Pa ($1 \times 10^{-5}$ Torr) where the distance between the center of each target and a wafer rotating at 10 rpm is 25 cm. In this case, since the Ar gas pressure is lower as compared with the other sputtering process where the Ar gas pressure is usually $1.33 \times 10^{-2}$ Pa ($1 \times 10^{-4}$ Torr), the scattering effect of particles caused by the Ar gas can be small. Also, since the distance between each target and the wafer is large, the direction of particles deposited on the wafer can be uniform. Further, since no plasma gas is present on the surface of the wafer in the ion beam sputtering process, the photoresist pattern is not heated, so that the photoresist pattern is not deformed. Then, the photoresist pattern is lifted off.

Next, an about 55 nm thick upper gap layer 7 made of alumina is deposited on the entire surface by a sputtering process. Then, an about 2 $\mu$m thick upper magnetic shield layer 8 made of NiFe and an about 0.1 $\mu$m thick record gap layer 9 made of alumina are sequentially deposited. Then, an about 2 $\mu$m thick magnetic pole layer 10 made of CoFeNi is formed by a plating process and is patterned. Then, an alumina layer 11 is coated.

When manufacturing the transducers of FIGS. 7, 10, 12 and 15, the spin valve structure 4 is etched by using the non-magnetic conductive layer 44 as a stopper. Also, the upper magnetic shield layer 8 is formed without the formation of the upper gap layer 7.

When manufacturing the transducers of FIGS. 8, 9, 10, 13, 14 and 15, the upper magnetic shield layer 8 is formed with the formation of the upper gap layer 7.

When manufacturing the transducers of FIGS. 11, 12, 13, 14 and 15, the lower magnetic shield layer 2 is not formed, and the spin valve structure 4 or 4A is formed directly on a NiZn ferrite substrate 2A.

Figure 16:
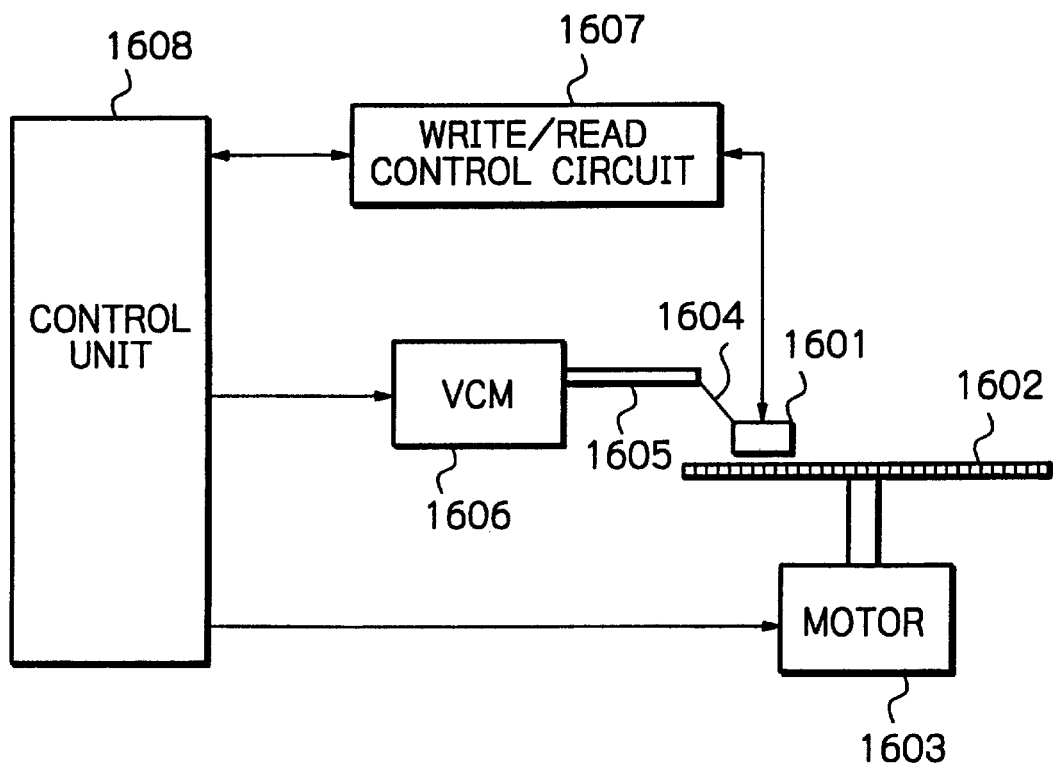
FIG. 16 is a block circuit diagram illustrating a magnetic storage apparatus to which the transducer according to the present invention is applied.

The transducer according to the present invention is applied to a magnetic storage apparatus as illustrated in FIG. 16. In FIG. 16, a magnetic white/read head 1601 including the transducer according to the present invention faces a magnetic medium 1602 rotated by a motor 1603. The magnetic write/read head 1601 is coupled via a suspension 1602 to an arm 1603 driven by a voice coil motor 1606. Thus, the magnetic write/read head 1601 is tracked by the voice coil motor 1606 on the magnetic medium 1602. The magnetic write/read head 1602 is controlled by a write/read control circuit 1607. Also, the motor 1603, the voice coil motor 1606 and the write/read control circuit 1607 are controlled by a control unit 1608. As explained above, the transducer according to the present invention can have a reproducing gap of less than 0.1 $\mu$m for 500 kFCI, if the coercive force of the magnetic medium 1602 is more than 276.5 kA/m (3500 Oe) and the distance between the head 1601 and the magnetic medium 1602 is less than 30 nm, the magnetic storage apparatus of FIG. 16 can have a storage capacity of more than 40 Gbits per square inch.

According to the present invention, the reproducing gap of a spin valve type transducer can be less than 0.1 $\mu$m for 500 kFCI.

What is claimed is:

1. A spin valve transducer comprising:

first and second magnetic shield layers;

a patterned magnetoresistance element in direct contact with said first shield layer;

a magnetic isolation layer formed on sides of said patterned magnetoresistance element in direct contact with said first magnetic shield layer; and a permanent magnet layer formed on said magnetic isolation layer; wherein said patterned magnetoresistance element comprises:

a pinning layer comprising antiferromagnetic material;

a pinned layer comprising ferromagnetic material adhered to said pinning layer;

a free layer comprising ferromagnetic material; and a non-magnetic conductive layer sandwiched by said pinned layer and said free layer;

said free layer comprising a single magnetic domain controlled by said permanent magnet layer.

2. A spin valve transducer comprising:

first and second magnetic shield layers;

a magnetoresistance element including a patterned portion and a non-patterned portion in direct contact with said first magnetic shield layer; and a permanent magnet layer formed on said non-patterned portion of said magnetoresistance element, said patterned portion of said magnetoresistance element comprising at least a free layer made of ferromagnetic material.

3. A spin valve transducer comprising:

first and second magnetic shield layers;

a magnetoresistance element including a patterned portion and a non-patterned portion in direct contact with said first magnetic shield layer; and a permanent magnet layer formed on said non-patterned portion of said magnetoresistance element;

an electrode layer formed on said permanent magnet layer; and a gap layer interposed between said patterned portion of said magnetoresistance element and said second magnetic shield layer and between said electrode layer and said second magnetic shield layer.

4. The transducer as set forth in claim 2, wherein said second magnetic shield layer is in direct contact with said patterned portion of said magnetoresistance element and said electrode layer.

5. The transducer as set forth in claim 2, wherein said first magnetic shield layer comprises insulating material.

6. The transducer as set forth in claim 2, wherein a reproducing gap between said first and second magnetic shield layers is less than 0.1 $\mu$m.

7. The transducer as set forth in claim 2, further comprising a non-magnetic insulating substrate on which said first magnetic shield layer is formed.

8. The transducer as set forth in claim 7, wherein said first magnetic shield layer comprises a soft-magnetic ferrite.

9. The transducer as set forth in claim 2, wherein said first magnetic shield layer comprises a non-magnetic substrate.

10. The transducer as set forth in claim 2, wherein said first magnetic shield layer comprises an insulating substrate comprising a soft magnetic ferrite.

11. A spin valve transducer comprising:

two magnetic shield layers;

a magnetoresistance element in direct contact with one of said two shield layers; and a permanent magnet layer formed on sides of said magnetoresistance element, wherein said magnetoresistance element comprises a patterned portion connected to ends of said permanent magnet layer and a non-patterned portion interposed between said one of said magnetic shield layers and said permanent magnet layer, wherein said magnetoresistance element comprises:

a pinning layer comprising antiferromagnetic material;

a pinned layer comprising ferromagnetic material adhered to said pinning layer;

a free layer comprising ferromagnetic material; and a non-magnetic conductive layer sandwiched by said pinned layer and said free layer, said patterned portion being formed by said free layer, said non-patterned portion being formed by said pinning layer, said pinned layer and said non-magnetic conductive layer.

* * * * *